United States Patent
Van Giesen et al.

(10) Patent No.: US 12,446,330 B2
(45) Date of Patent: Oct. 14, 2025

(54) PHOTOVOLTAIC PACKAGING, AND A METHOD FOR MANUFACTURING SUCH A PHOTOVOLTAIC PACKAGING

(71) Applicant: SABIC GLOBAL TECHNOLOGIES B.V., Bergen Op Zoom (NL)

(72) Inventors: Roland Van Giesen, Geleen (NL); Henrica Norberta Alberta Maria Steenbakkers-Menting, Geleen (NL); Rick Robert Emilie Bercx, Geleen (NL); Maud Corrina Willie Van Der Ven, Geleen (NL); Rob Venderbosch, Geleen (NL)

(73) Assignee: SABIC GLOBAL TECHNOLOGIES B.V., Bergen Op Zoom (NL)

( * ) Notice: Subject to any disclaimer, the term of this patent is extended or adjusted under 35 U.S.C. 154(b) by 359 days.

(21) Appl. No.: 16/474,181

(22) PCT Filed: Dec. 22, 2017

(86) PCT No.: PCT/EP2017/084537
§ 371 (c)(1),
(2) Date: Jun. 27, 2019

(87) PCT Pub. No.: WO2018/122203
PCT Pub. Date: Jul. 5, 2018

(65) Prior Publication Data
US 2021/0305445 A1    Sep. 30, 2021

(30) Foreign Application Priority Data
Jan. 2, 2017  (EP) ..................................... 17150032

(51) Int. Cl.
*H01L 31/042* (2014.01)
*H10F 19/85* (2025.01)
(Continued)

(52) U.S. Cl.
CPC ........... *H10F 19/85* (2025.01); *H10F 19/902* (2025.01); *H10F 71/137* (2025.01)

(58) Field of Classification Search
CPC .............................. H10F 71/137; Y02E 10/50
See application file for complete search history.

(56) References Cited

U.S. PATENT DOCUMENTS 4,009,054 A * 2/1977 Gochermann ........ H01L 31/048
156/99
4,104,083 A * 8/1978 Hirano .................. H01L 31/048
156/60

(Continued)

FOREIGN PATENT DOCUMENTS

EP     2671705    *  6/2013
EP     2629339 A     8/2013
(Continued)

OTHER PUBLICATIONS

International Search Report; International Application No. PCT/EP2017/084537; International Filing Date: Dec. 22, 2017; Date of Mailing: Mar. 6, 2018; 4 pages.

(Continued)

*Primary Examiner* — Thanh Truc Trinh
(74) *Attorney, Agent, or Firm* — CANTOR COLBURN LLP

(57) ABSTRACT

The present teachings relate to a photovoltaic packaging comprising a polymer back layer, photovoltaic cells electrically connected to each other, a polymer front layer which is transparent to light, and which is configured to be connected to the polymer back layer by means of welding, wherein the photovoltaic cells are located between the front and back layer, the front and back layer being connected to each other by means of a welded connection, such that the photovoltaic cells is completely enclosed between the front layer and the back layer by the welded connection, sur- (Continued)

rounding the photovoltaic cells, and wherein each individual cell is separated from the remaining of the photovoltaic cells by the welded connection. The present teachings also relate to a method of manufacturing, and to a solar panel.

16 Claims, 8 Drawing Sheets

(51) Int. Cl.
*H10F 19/90* (2025.01)
*H10F 71/00* (2025.01)

(56) References Cited

U.S. PATENT DOCUMENTS

| | | | |
|---|---|---|---|
| 4,562,637 A * | 1/1986 | Kushima | H01L 31/0512 219/121.64 |
| 5,437,735 A | 8/1995 | Younan et al. | |
| 5,575,861 A * | 11/1996 | Younan | H02S 20/23 136/251 |
| 5,707,459 A * | 1/1998 | Itoyama | H10F 19/85 136/251 |
| 7,098,395 B2 * | 8/2006 | Hiraishi | B32B 17/10018 257/434 |
| 2005/0274410 A1 | 12/2005 | Yuuki et al. | |
| 2009/0000222 A1 * | 1/2009 | Kalkanoglu | B29C 43/56 52/173.3 |
| 2010/0089438 A1 * | 4/2010 | Reyal | H01L 31/048 136/251 |
| 2012/0085391 A1 | 4/2012 | Varde et al. | |
| 2015/0034147 A1 | 2/2015 | Le Perchec et al. | |
| 2015/0263196 A1 | 9/2015 | Meisel et al. | |
| 2016/0351740 A1 | 12/2016 | Nishio et al. | |
| 2017/0005215 A1 | 1/2017 | Wang et al. | |

FOREIGN PATENT DOCUMENTS

| | | |
|---|---|---|
| FR | 2349959 A1 | 11/1977 |
| JP | 60214550 A | 10/1985 |
| WO | 2009080281 A1 | 7/2009 |

OTHER PUBLICATIONS

Written Opinion; International Application No. PCT/EP2017/084537; International Filing Date: Dec. 22, 2017; Date of Mailing: Mar. 6, 2018; 7 pages.

* cited by examiner

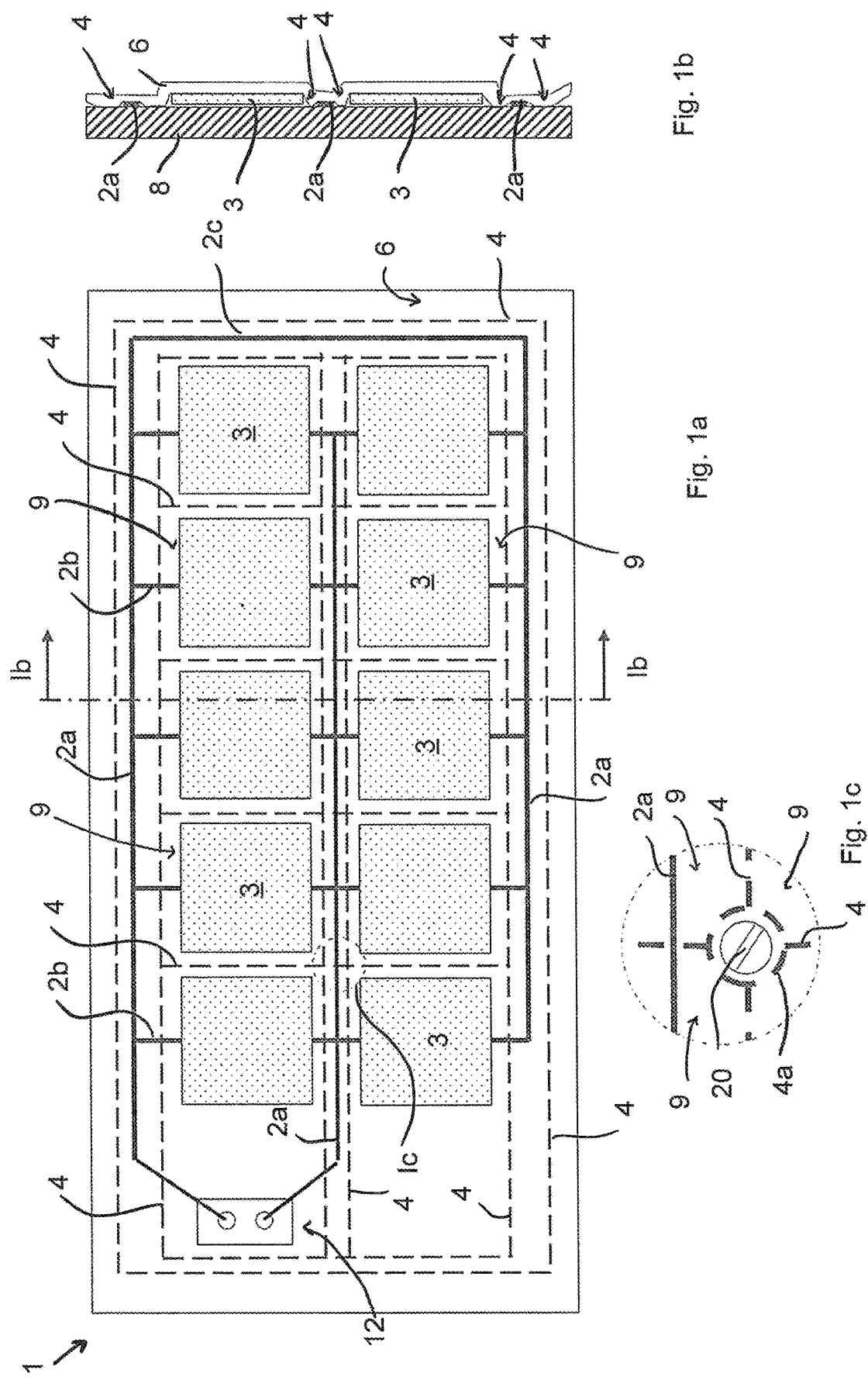

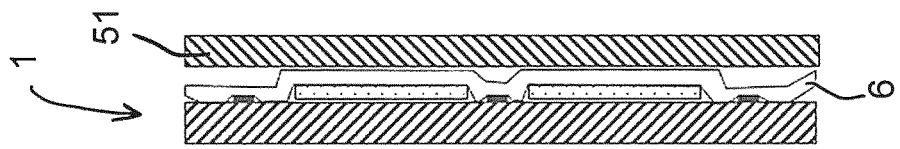
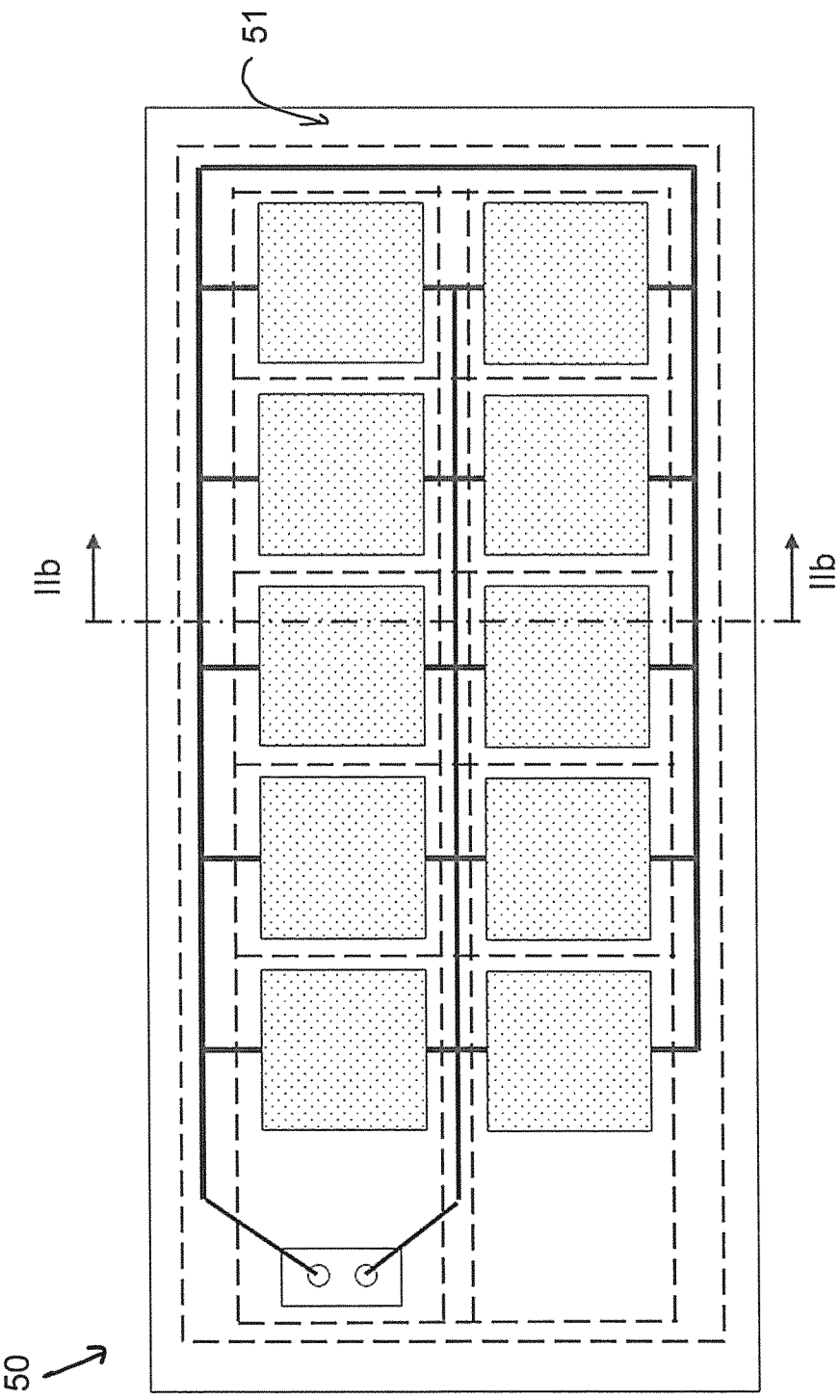

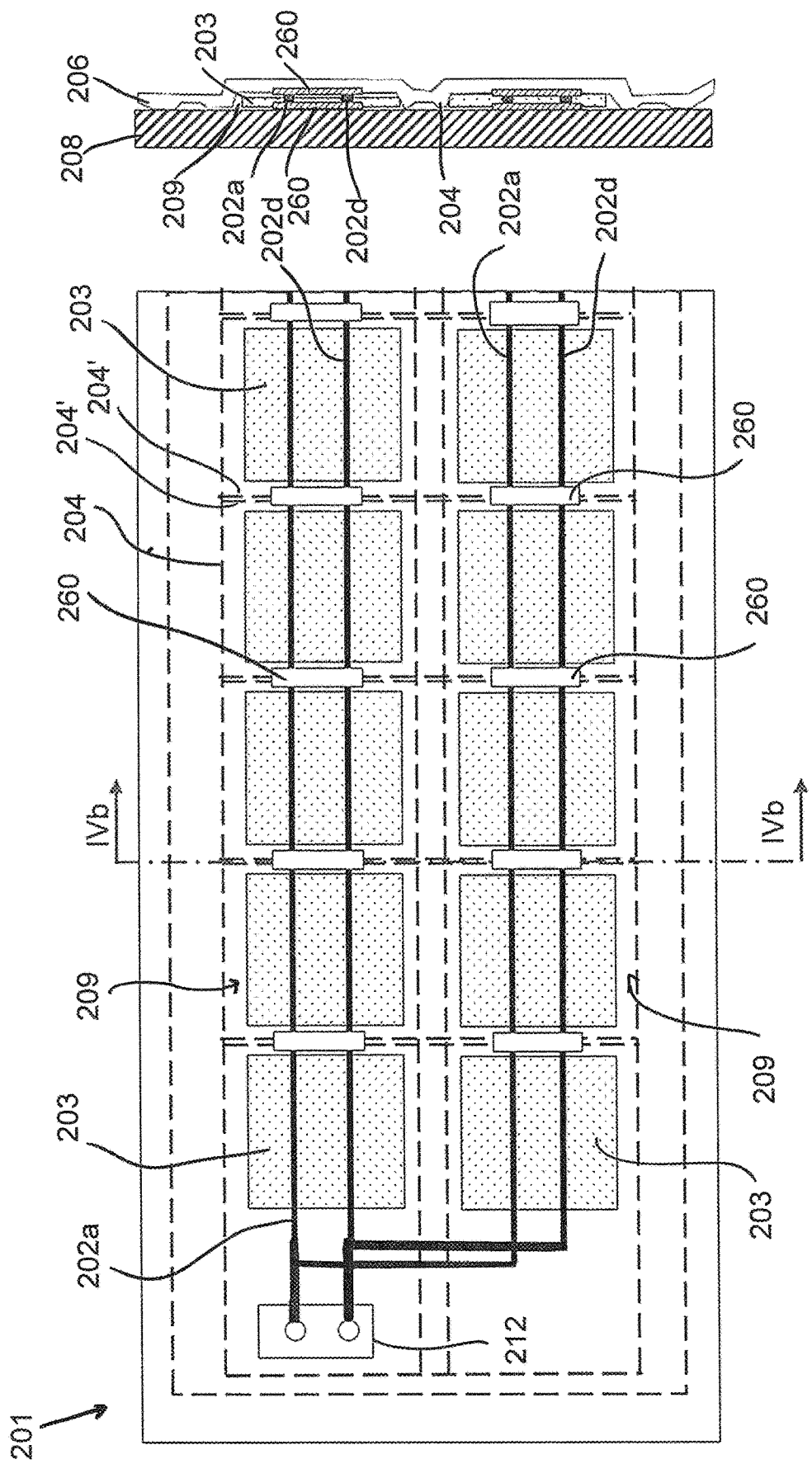

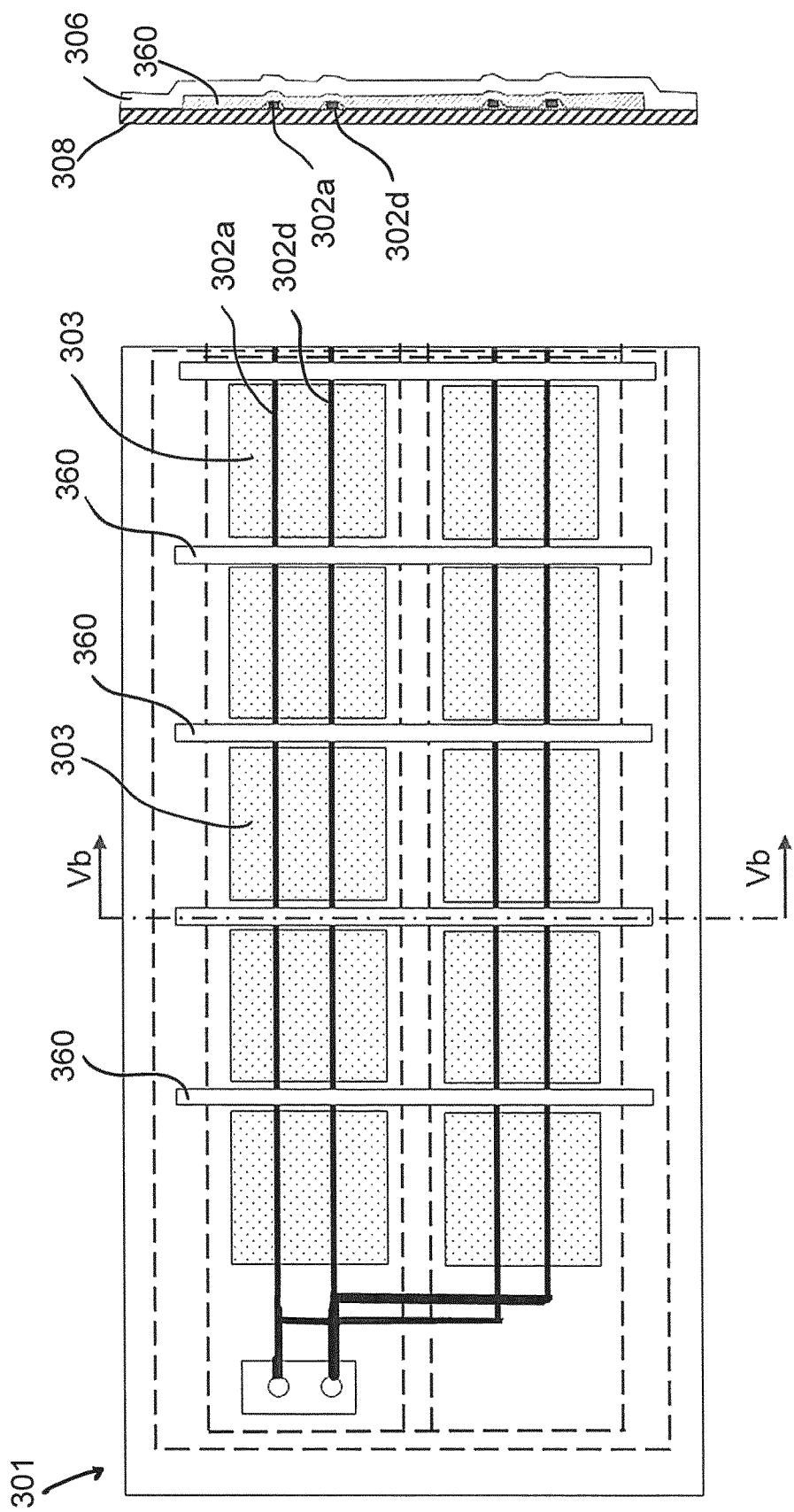

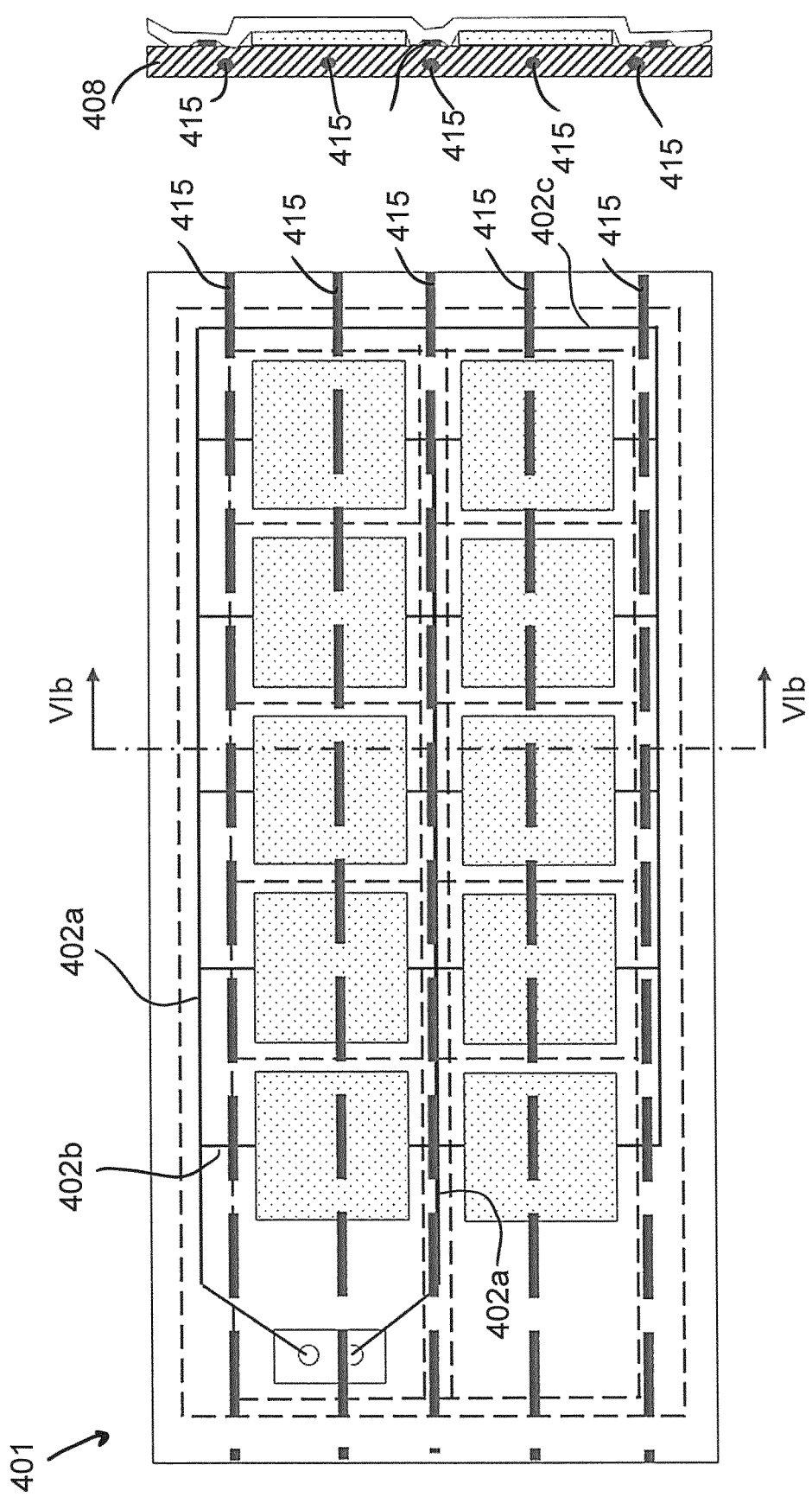

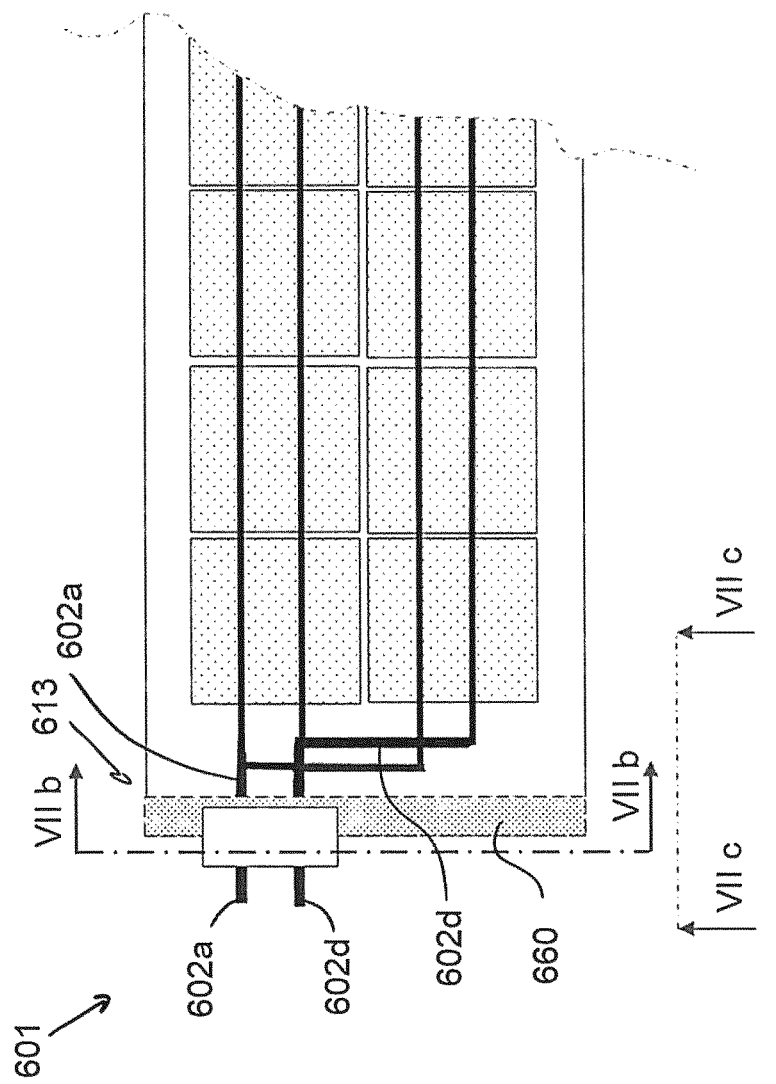

PHOTOVOLTAIC PACKAGING, AND A METHOD FOR MANUFACTURING SUCH A PHOTOVOLTAIC PACKAGING

CROSS REFERENCE TO RELATED APPLICATIONS

This application is a 371 of International Application No. PCT/EP2017/084537, filed Dec. 22, 2017, which is incorporated by reference in its entirety, and which claims priority to European Application No. 17150032.5, filed Jan. 2, 2017.

TECHNICAL FIELD

The present teachings relate to a photovoltaic packaging having a plurality of electrically interconnected photovoltaic, or, solar, cells placed in between a front layer and a back layer. The present teachings also relate to a method for manufacturing such a photovoltaic packaging.

SUMMARY

An object of the invention is to provide a photovoltaic packaging which can be manufactured in an efficient manner at low costs, and which can be recycled in an efficient manner, to a large degree.

In a first aspect, the invention relates to a photovoltaic packaging, as defined in claim 1. According to the invention, a photovoltaic packaging is provided, comprising:
  a polymer back layer,
  a plurality of photovoltaic cells electrically connected to each other by electrical conductors,
  a polymer front layer which is transparent to light, and which is configured to be connected to the polymer back layer by means of welding,
wherein the plurality of mutually connected photovoltaic cells are located between the front layer and the back layer, the front layer and the back layer being connected to each other by means of a welded connection, such that the plurality of photovoltaic cells is completely enclosed between the front layer and the back layer by the welded connection, surrounding the plurality of photovoltaic cells, and wherein each individual cell of the plurality of photovoltaic cells is separated from the remaining of the photovoltaic cells by the welded connection.

The photovoltaic packaging according to the present teachings can be manufactured efficiently because lamination of encapsulant layers, which is time consuming and expensive, is no longer required. That means, according to the present invention the plurality of mutually connected photovoltaic cells may be located between the front layer and the back layer in the absence of any encapsulant layers. Thus, in an embodiment, the packaging is free from encapsulant layers which encapsulate and fully embed photovoltaic cells, so that the front layer and the back layer are in direct contact with the plurality of photovoltaic cells. According to the invention, the front layer and the back layer may thus be connected directly to each other by means of the welded connection, along at least substantially the entire welded connection.

Enclosing the plurality of photovoltaic cells between the polymer front and back layer by means of welding of said layers to each other is a very effective and cost efficient manner of protecting the photovoltaic cells from external influences like moisture and dust. Also, during recycling, the photovoltaic cells can easily be separated from the front and back layers, such as by cutting though said layers. Because each individual cell of the plurality of photovoltaic cells is separated from the remaining of the photovoltaic cells by the welded connection, each of the cells is positioned at a defined location, or, pocket, defined by the welded connection, between the front and back layers.

Encapsulant layers are layers which encapsulate a photovoltaic cell, which fully embed the cell, and which may be melted or glued to it. Their function is to protect the photovoltaic cell. An encapsulant, such as of ethylene-vinyl acetate (EVA), may have been provided in thin sheets placed on top of and underneath the solar cell. This sandwich has then been heated to 150° C. to polymerize the EVA and bond the encapsulant, the cell, and optionally also a front panel, or, top layer, and rear panel of a solar module together.

In an embodiment, the welds mutually connecting the front and back layer are laser welds. In that case, one of the front layer and the back layer is laser transmissive, while the other of the front layer and the back layer is laser absorbent. The melting temperature of the front and back layer are similar, or at least the melting temperature range is overlapping. The laser welds preferably are discrete, linear. That is, the laser welded connection by means of which the front layer and the back layer are connected follows lines, that is, they are line-shaped.

In an embodiment, the front and back layer of the photovoltaic packaging are configured such that the plurality of photovoltaic cells do not adhere, or at most reversibly adhere, to either the front layer and the back layer.

The photovoltaic, or, solar cells are commercially available solar cells such as wafer-based cells such as made of crystalline silicon.

For the purpose of the invention, with "transparent to light" is meant transparent to light to such an extent that in use of the photovoltaic packaging electrical power is generated by the plurality of photovoltaic cells due to incident sunlight. For the purpose of the invention, with transparent to light is meant that the polymer front layer allows at least an average of 65%, preferably at least an average of 70%, more preferably at least an average of 75%, most preferably at least an average of 80% transmission of light in the wavelength range of 350 nm to 1200 nm as compared to a situation without the polymer front layer, when measuring the transmittance curves (full spectrum from 200-2500 nm) using a Perkin Elmer Lambda 950 according to ASTM D1003 (used lamp: halogen in combination with deuterium lamp). That means that the transmission of light is measured according to ASTM D1003.

In an embodiment each individual cell of the plurality of photovoltaic cells of the photovoltaic packaging is separated from the remaining of the photovoltaic cells by a continuous welded connection between the front layer and the back layer, the continuous welded connection extending around the individual cell, that means, around the perimeter of the individual cell. Such a continuous welded connection fully separates each of the cells from the remaining of the cells.

The welded connection may comprise more than one weld passing between each two adjacent photovoltaic cells of the plurality of photovoltaic cells. This increases the reliability of the sealing, and thus protection, of the photovoltaic cells from the external influences as mentioned above.

The polymer front layer may be a sheet having a thickness in the range of 20 to 1000 micrometer, preferably of 100 to 500 micrometer.

The polymer back layer may be a sheet having a thickness in the range of 300 to 10000 micrometer, preferably of 300 to 3000 micrometer.

The polymer of the front layer and/or of the back layer may be chosen from the group consisting of polyolefins, such as homopolymers (PP) or random copolymers (rPP) of polypropylene, for example a polymer prepared from propylene and ethylene monomore, for example from at least 90 wt % propylene and at most 10 wt % ethylene; polyethylene (PE), e.g. linear low density polyethylene (LLDPE) or other polymers, such as polyethylene terephthalate (PET), polybutylene terephthalate (PBT), polycarbonates (PC), polymethylmethacrylate (PMMA), silicons and fluoroplastomers. The back layer may have a foamed core. Examples of materials that may be (laser) welded together include but are not limited to PP/rPP with PP, PET with PET, PET with PBT, LLDPE with PE, PC with PC and PMMA with PMMA.

The polymer front layer is transparent to light. The polymer back layer may be prepared from a long glass fiber reinforced polypropylene, such as made by the process described in WO 2009/080281, which disclosure is incorporated by reference.

Pellets comprising a thermoplastic polymer sheath intimately surrounding glass filaments, which glass filaments are covered at least in part with an impregnating agent and extend in a longitudinal direction of said pellets, are for example commercially available under the brand name STAMAX.

A process for manufacturing such pellets is known from WO 2009/080281, which process comprises the subsequent steps of:
a) unwinding from a package of at least one continuous glass multifilament strand containing at most 2% by mass of a sizing composition;
b) applying from 0.5 to 20% by mass of an impregnating agent to said at least one continuous glass multifilament strand to form an impregnated continuous multifilament strand;
c) applying a sheath of thermoplastic polymer around the impregnated continuous multifilament strand to form a sheathed continuous multifilament strand;

wherein the impregnating agent is non-volatile, has a melting point of at least 20° C. below the melting point of the thermoplastic matrix, has a viscosity of from 2.5 to 100 cS at application temperature, and is compatible with the thermoplastic polymer to be reinforced.

In an embodiment, the front layer and/or the back layer may have an adhesive layer on their side facing the plurality of photovoltaic cells, wherein the composition of the adhesive of the adhesive layer is such that a self-adhesive effect is obtained after bringing the respective layer in contact with a photovoltaic cell, in such a manner that hardly any residual adhesive will remain behind on the photovoltaic cells, if at all, after removal of the respective layer from the photovoltaic cell. In this embodiment the front layer and/or the back layer thus reversibly adhere to the plurality of photovoltaic cells. In practice this can be accomplished by an adhesive that is known to the skilled person. The adhesive provides temporary adhesion until the respective layer is removed, which adhesive allows easy removal of the layer. Such an adhesive does not lose its adhesive strength, or at most to a limited degree, after a connection between two parts which has been effected by means of the adhesive in question is broken by separating the parts that have been joined together by means of the adhesive joint. Said adhesive remains behind on a first part, to which the adhesive had originally been applied. Because the adhesive does not lose its adhesive strength, or at most to a limited extent when the connection is broken, the adhesive can be reused for effecting an adhesive joint with the same second part of with another second part.

Use of such an adhesive for the front layer results in the front layer being in direct contact with the photovoltaic cells, thus having no, or at most a very small, air layer in between them. This is of positive influence on the efficiency of the photovoltaic cells. Use of such an adhesive also makes recycling more efficient, since the both components may be separated from each other easily.

The plurality of photovoltaic cells may be electrically connected to each other in a parallel electrical configuration, and alternatively in series configuration. In embodiments, the plurality of cells may be divided in various groups, wherein each cell of a group is connected in series to the other cells of that group, while groups may be connected in parallel, for example.

The electrical conductors may be metal strips such as comprising copper, aluminium and/or silver. Alternatively the electrical conductors may be metal wires.

The photovoltaic packaging according to the invention may further comprise a piece, such as a strip, of encapsulant extending over any electrical conductors between adjacent photovoltaic cells of the plurality of photovoltaic cells. The piece of encapsulant is heat-sealable, and may be sealingly connected to the conductors. This means that the front layer and the back layer are connected directly to each other by means of the welded connection, along substantially the entire welded connection.

The packaging according to the invention may have a width, and may comprise a plurality of strips of encapsulant each extending in a continuous manner over the width of the photovoltaic packaging, between adjacent photovoltaic cells of the plurality of photovoltaic cells. The welded connection may extend over a strip and thus directly connect the front and the back layer together except for the, small, locations of the encapsulant strips where the front layer, strip material and back layer are welded to each other (the encapsulant strip separating the front layer and the back layer). This means that the front layer and the back layer are connected directly to each other by means of the welded connection, along substantially the entire welded connection.

In an embodiment, the packaging may have a plurality of elongate, wire-shaped, metal reinforcement elements, such as metal wires, preferably steel wires, incorporated within the back layer, distributed over the width of the back layer and extending along the length of the back layer. Such a packaging is highly resistant to burning objects from the outside. The plurality of elongate metal reinforcement elements may provide sufficient protection against such objects passing through the packaging by melting the packaging material, in particular the front and back layer, or at least provide sufficient delay.

The plurality of elongate metal reinforcement elements may be incorporated within the back layer by lamination, extrusion or injection moulding. Extrusion is preferred.

The invention further relates to a method for manufacturing a photovoltaic packaging as defined in claim 13. According to the invention, a method for manufacturing a photovoltaic packaging is provided, the method comprising:
providing a polymer front layer and a polymer back layer,
providing a plurality of photovoltaic cells electrically connected to each other by electrical conductors,
placing the plurality of photovoltaic cells between the front layer and the back layer,
welding the front layer and the back layer together, such that the plurality of photovoltaic cells is completely enclosed between the front layer and the back layer by the welded connection, surrounding the plurality of photovoltaic cells, and wherein each individual cell of the plurality of photovoltaic cells is separated from the remaining of the photovoltaic cells by the welded connection.

In an embodiment, the method further comprises the step of placing a piece, such as a strip, of encapsulant extending over any electrical conductors between adjacent photovoltaic cells of the plurality of photovoltaic cells, between the front layer and the back layer, and melting the piece of encapsulant to at least one of the front layer and the back layer.

The invention also relates to a solar panel having a rigid, UV protective top layer which is transparent to light, such as a glass plate, connected to a photovoltaic packaging according to the invention on a front, sun facing side of the photovoltaic packaging. The person skilled in the art knows how to increase the resistance to UV (decreased degradation of the material under the influence of sunlight) of materials, for example by adding UV stabilizers as are known in the art.

Advantages of the method and solar panel according to the invention are analogous to the above mentioned advantages of the photovoltaic packaging according to the invention. Corresponding embodiments of the packaging are also applicable for the method and solar panel according to the present teachings, and vice versa.

BRIEF DESCRIPTION OF DRAWINGS

The present teachings are described hereinafter with reference to the accompanying schematic drawings in which examples of the invention are shown and in which like reference numbers indicate the same or similar elements.

FIG. 1a shows, in plan view, a first example of a photovoltaic packaging according to the present invention, FIG. 1b shows section Ib-Ib of the packaging of FIG. 1a, FIG. 1c shows detail Ic of the packaging of FIG. 1a, FIG. 2a shows, in plan view, an example of a solar panel according to the invention, comprising the photovoltaic packaging according to FIG. 1a, FIG. 2b shows section IIb-IIb of the panel of FIG. 2a, FIG. 3a shows, in plan view, a second example of a photovoltaic packaging according to the present invention, FIG. 4b shows section IVb-IVb of the packaging of FIG. 4a, FIG. 5a shows, in plan view, a fourth example of a photovoltaic packaging according to the present invention, FIG. 5b shows section Vb-Vb of the packaging of FIG. 5a, FIG. 6a shows, in plan view, a fifth example of a photovoltaic packaging according to the present invention, FIG. 6b shows section VIb-VIb of the packaging of FIG. 6a, FIG. 7a shows, in partial plan view, a sixth example of a photovoltaic packaging according to the present invention.

DESCRIPTION OF EMBODIMENTS

Figures 3A, 3B:
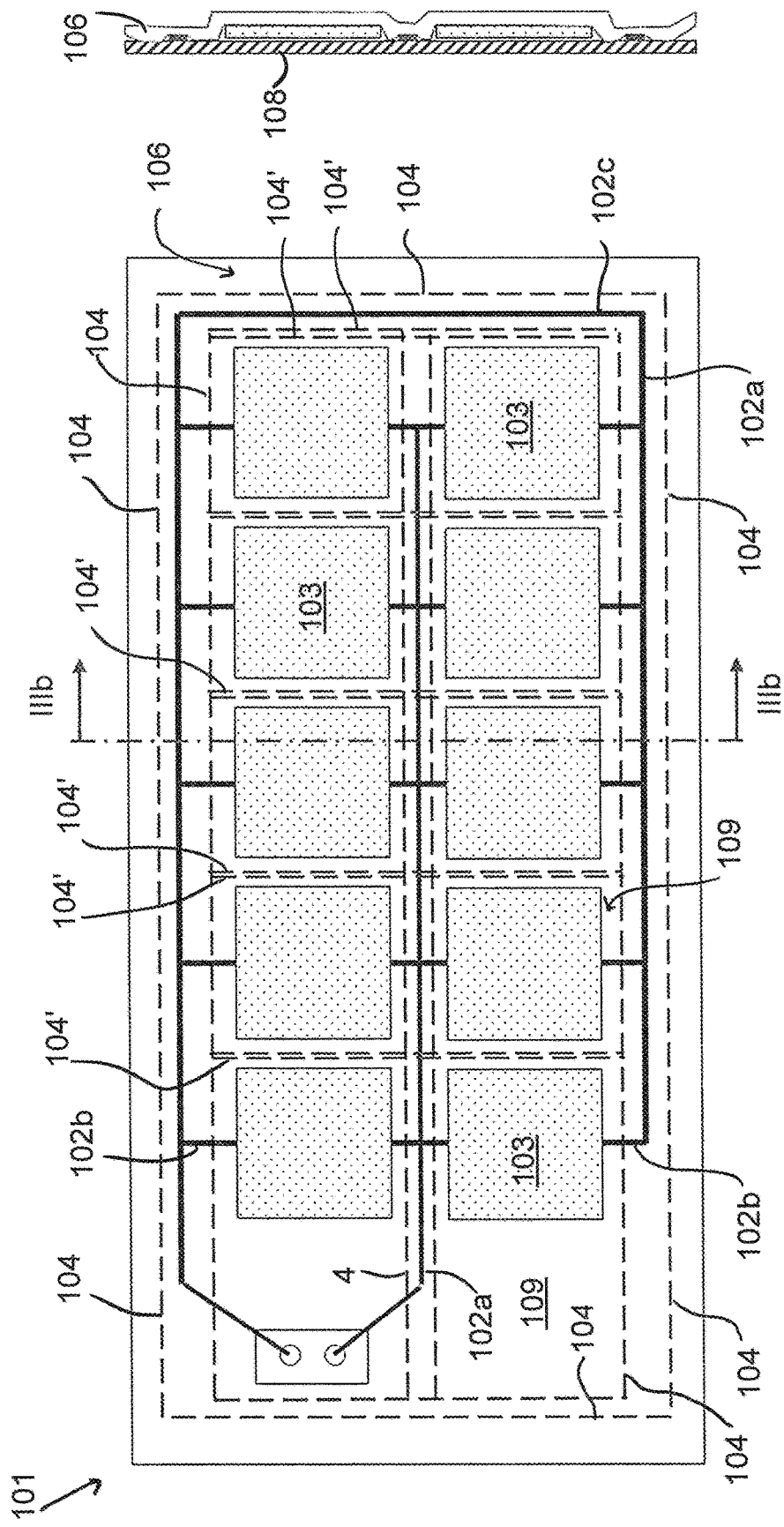
FIG. 3b shows section IIIb-IIIb of the packaging of FIG. 3a, FIG. 4a shows, in plan view, a third example of a photovoltaic packaging according to the present invention.

FIGS. 1a and 1b show a photovoltaic packaging 1 according to the present invention. The photovoltaic packaging 1 has ten photovoltaic cells, or, solar cells 3 in two parallel rows of five cells 3, while in practice the photovoltaic packaging may have less or (much) more solar cells such as a grid of six times ten solar cells. The solar cells 3 are mutually connected in an electrical manner by electrical conductors in the form of copper strips 2a, 2b, 2c. The strips 2a extend in the longitudinal direction of the packaging 1 while the strips 2b and 2c extend in the transverse direction. The main strips 2a extend between rows of solar cells 3 and are electrically connected to respective electrical contacts on the back side of each of the cells 3 by means of transverse strips 2b extending between a main strip 2a and an electrical contact of a solar cell 3. As FIG. 1a shows, the ten cells 3 are in electrical connection in a parallel configuration while the two rows share a central longitudinal strip of the strips 2a, which may be the (−)-wire. The two outer strips of the strips 2a are connected by the transverse strip 2c and may be the (+)-wire. Such a parallel configuration may result in a higher durability as compared to the series configuration as shown in FIG. 4a (to be detailed below) because of the increased capability of the photovoltaic packaging 1 to deal with temperature differences between the copper strips 2a and the below described front and back sheets 6, 8. In case of lengthening of the main strips 2a due to a temperature rise, the transverse strips 2b may bend slightly in case that the solar cells 3 remain in place. This reduces the forces at, normally soldered, electrical connections between strips and solar cell contacts. Instead of strip-shaped conductors, conductors of other shapes may be used, such as wire-shaped conductors, i.e. conductive wires, such as of copper or aluminium.

The rows of cells 3 thus formed may comprise a larger number of cells, such as ten cells. The panel may comprise a plurality of such rows, such as six rows. Regarding the number of solar cells, the above holds in an analogous manner for the further examples of packagings to be described below.

The photovoltaic packaging 1 has a polymer back layer in the form of a back sheet 8 of polypropylene. The back sheet 8 has a thickness of 500 micrometer. The photovoltaic packaging also has a polymer front layer which is light transparent to such an extent that in use of the photovoltaic packaging 1 electrical power is generated by the plurality of photovoltaic cells 3 due to incident sunlight. The front layer is in the form of a front sheet 6 of polypropylene. The thickness of the front sheet 6 is 200 micrometer. The solar cells 3 are located between the front sheet 6 and back sheet 8 and do not adhere to either the front sheet 6 or the back sheet 8. Also, the front sheet 6 does not adhere to the back sheet 8, as visualized schematically in FIG. 1b.

The front sheet 6 is connected locally to the back sheet 8 by means of laser welds 4 (indicated by dashed lines), i.e connected by means of laser welding. The photovoltaic packaging 1 has longitudinal welds 4 in the direction of the rows, on each side of each row, and transverse welds between each two adjacent cells 3, thereby creating ten pockets 9, one pocket 9 for each individual cell 3. Thus, laser welds 4 surround each individual solar cell 3 so that each cell 3 is enclosed in a pocket 9 defined by the front sheet 6 and back sheet 8 and one or more of the laser welds 4. As FIG. 1a shows, a transverse connecting strip 2b from a cell 3 to a conductor strip 2a extends through a longitudinal weld 4.

The (+)-wire and (−)-wires 2a can be connected to an external power cable via a junction box 12 which provides a sealed electrical external connection of the conductor strips 2a.

FIG. 1c shows in detail a junction of a longitudinal and a transverse weld 4. At the junction, a circular weld part 4a may be provided. This way, a photovoltaic packaging connecting element such as a screw 20 may safely be passed through the front 6 and back 8 sheets without compromising the full enclosure and thereby sealing from external influences such as moist and dust, of each cell 3 in its pocket 9. Using such connecting elements, the packaging may be connected to a surrounding structure such as a supporting structure.

FIGS. 2a and 2b show a solar panel 50 according to the invention. The solar panel 50 comprises the photovoltaic packaging 1 of FIGS. 1a-1c and a rigid, UV protective top layer which is transparent to light, in the form of a glass plate 51, connected to a top, sun facing side of the front sheet 6 by means of gluing the glass plate 51 to the front sheet 6, such as using an above-described "Post-it" adhesive. The glass plate 51 is of the same size, seen in plan view, as the front sheet 6 and back sheet 8. The solar panel 50 may additionally have a rigid further back layer in the form of a back plate connected to the back sheet, such as by means of gluing, for further strengthening of the solar panel.

FIGS. 3a and 3b show a photovoltaic packaging 101 which is to a large extent identical to the packaging 1 of FIGS. 1a-1b. Like photovoltaic packaging 1, the photovoltaic packaging 101 has a front sheet 106 and a back sheet 108, in this example both made of polyethylene and having a thickness of 300 micrometer. Conductor strips 102a, 102b, 102c are provided to mutually connect the cells of the plurality of solar cells 103 in an electrical manner, like packaging 1. Also, the front sheet 106 is connected locally to the back sheet 108 by means of laser welds 104. A laser weld 104, 104' extends continuously around each individual solar cell 103 so that each cell 103 is fully enclosed in a pocket 109 defined by the front sheet 106 and back sheet 108, as is the case with packaging 1. The difference is that each cell 103 of packaging 101 is completely surrounded by two welds, because two transverse welds 104' extend between each two adjacent cells 103 instead of one transverse weld in the packaging of FIG. 1a. for the remainder, the above description of packaging 1 applies in an analogous manner.

FIGS. 4a and 4b show a photovoltaic packaging 201 according to the present invention. The photovoltaic packaging 201 has ten photovoltaic, or, solar cells 203 in two parallel rows of five cells 203. The solar cells 203 are mutually connected in an electrical manner by electrical conductors in the form of copper strips 202a and 202d connected to respective electrical contacts on the back side of each of the cells. The strips 202a are mutually connected and may form a (+)-wire. The strips 202d are also mutually connected but are electrically isolated from the wires 202a and may form a (−)-wire. Both the (+)- and (−)-wire extend to a junction box 212 where they may be connected to an external power cable. As FIG. 4a shows, the five cells 203 of each of the two rows are in electrical connection in a series configuration while the two rows are connected in parallel.

The back layer 208, the front layer 206, and the pattern of welds 204, 204' is the same as in the packaging 101 of FIG. 3a-3b. Other than packaging 101, conductor strips 202a and 202d pass through transverse welds 204'. At the respective intersection of a conductor strip 202a or 202d and a pair of transverse welds 204' between two adjacent cells 203, a piece of encapsulant material 260, such as of EVA, is provided at the location of the pair of transverse welds 204', between the back layer 208 and the strip 202a and 202d of a row of cells 203. A piece of encapsulant material 260 is also provided between the front layer 206 and the same strips 202a and 202d, above the first-mentioned piece 260. The two pieces of encapsulant material 260 between which the strips 202a and 202d pass increase the sealing between two adjacent pockets 209. The two stacked pieces of encapsulant material 260 are melted to the front sheet 206 and back sheet 208 and to each other, while the strips 202a and 202b pass between them. In an embodiment, a piece of encapsulant material may only be provided below, or alternatively on top of, the conductor strips. Such a piece thus connects to the front sheet 206 as well as to the back sheet 208.

The photovoltaic packaging 301 of FIGS. 5a and 5b is highly similar to packaging 201, except for the thickness of the back sheet, which may also be identical to the back sheet of packaging 201, and except for the embodiment of the encapsulant material. Instead of individual pieces 260, packaging 301 has strips 360 of encapsulant material, such as of EVA, extending in transverse direction between adjacent cells 303. As a result, between adjacent cells 303 in longitudinal direction, the packaging 301 may be cut to length at the location of a transverse encapsulant strip 360, depending on the required number of cells 303 per row. In that case, a junction box, or at least an electrical connection, may be established with the conductor strips at the location of the cut. In an embodiment, the strips 360 may extend over the entire width of the packaging. As FIG. 5b shows, packaging 301 has a strip 360 on the top side of the conductor strips 302a and 302d only, that means between the front layer 306 and the strips 302a and 302d. In this case the strip 360 is thus melted to the front sheet 306 as well as to the back sheet 308. In a further embodiment, two of such strips 360 may each time be provided between adjacent cells, similar to the two strips 260 of packaging 201.

FIGS. 6a and 6b show a photovoltaic packaging 401 which is identical to packaging 1 except for the embodiment of the back sheet thereof. Packaging 401 has a back sheet 408 having a thickness of 400 micrometer. The back sheet 408 has five mutually parallel incorporated steel wires 415, for the purpose of reinforcing the back sheet 408. The back sheet 408 is made by co-extruding the wires 415 with the polymer of the back sheet. Alternatively the wires may be laminated between two sublayers of the back-sheet 408. The wires extend in the longitudinal direction of the packaging and less or more wires may be provided. The wires 415 are electrically isolated from conductor strips 402a-402c by the back sheet material. The wires 15 provide for an increased fire protection of any objects underneath the packaging in use. In case that an object on fire falls on top of the packaging 401, the wires 415 function as a safety net; the object may melt the front and back sheet of the packaging, but cannot pass through the wires 415. Such wires 415 may also be present in the other photovoltaic packagings according to the invention as described above.

Figure 7B:
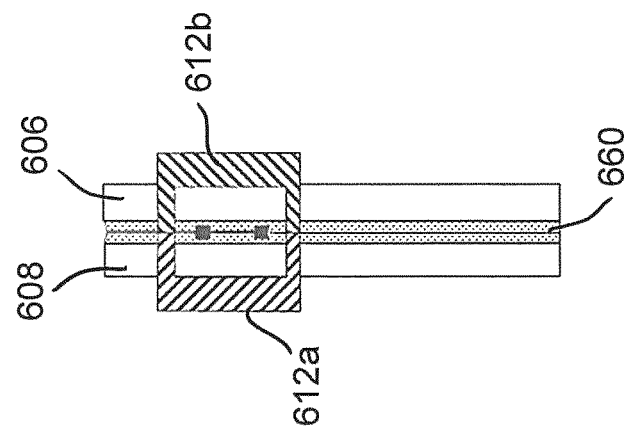
FIG. 7b shows section VIIb-VIIb of the packaging of FIG. 7a, and FIG. 7c shows a partial side view of the packaging of FIG. 7a, Throughout the figures, components which are equal, or at least function in a similar manner, have been indicated with the reference signs to which each time 100 is added.
Figure 7C:
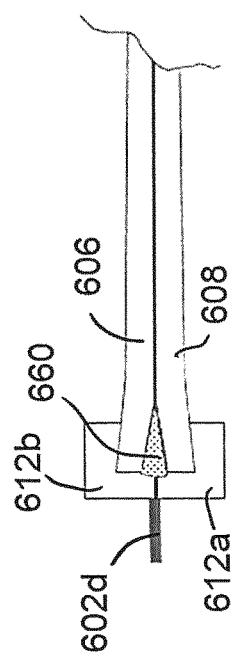

FIGS. 7a-7c show a part of a photovoltaic packaging 601 according to the invention, for the purpose of explaining an embodiment of a junction box 612 which may also be used in a similar manner in any of the packagings 1-401 according to the invention as described above. In this case the junction box 612 is formed at a transverse end 613 of the packaging 601 and it comprises two halves 612a and 612b which are glued to the transverse end 613. Encapsulant material 660 is melted between the front and back sheet 606, 608 at the end 613, to increase the sealing of the packaging 601. Conductor strips 602a and 602d extend through the encapsulant material 660 to the junction box 612.

The invention claimed is:

1. A photovoltaic packaging, comprising:
a polymer back layer,
a plurality of photovoltaic cells electrically connected to each other by electrical conductors,
a polymer front layer which is transparent to light, and which is configured to be connected to the polymer back layer by welding,
wherein the plurality of mutually connected photovoltaic cells are located between the front layer and the back layer,
the front layer and the back layer being locally connected to each other by a local welded connection, such that the plurality of photovoltaic cells is completely enclosed between the front layer and the back layer by the welded connection, surrounding the plurality of photovoltaic cells, and wherein each individual cell of the plurality of photovoltaic cells is separated from the remaining of the photovoltaic cells by the welded connection,
wherein the front layer is reversibly adhered to the photovoltaic cells by a reusable adhesive.

2. The photovoltaic packaging according to claim 1, wherein the front layer comprises a polyolefin.

3. The photovoltaic packaging according to claim 1, wherein the front layer comprises a polypropylene.

4. A photovoltaic packaging, comprising:
a back layer comprising a back layer polymer, the back layer extending from a first side to a second side, and extending from a first end to a second end,
a plurality of photovoltaic cells electrically connected to each other by electrical conductors, with a first electrical conductor positioned and extended along the first side of the back layer, and a second electrical conductor positioned and extended along the second side of the back layer, and a third electrical conductor positioned and extended along the back layer between the first and second electrical conductors and between a first row of photovoltaic cells and a second row of photovoltaic cells,
a fourth electrical conductor positioned and extended along the second end of the back layer, the fourth electrical conductor transverse to the first and second electrical conductors and connected to the first and second electrical conductors;
a front layer comprising a front layer polymer which is transparent to light, and which is configured to be connected to the back layer by welding,
wherein the plurality of photovoltaic cells are located between the front layer and the back layer,
the front layer and the back layer being directly connected to each other by a local line-shaped laser welded connection, such that the plurality of photovoltaic cells is completely enclosed between the front layer and the back layer by the local line-shaped laser welded connection that surrounds the plurality of photovoltaic cells, and wherein each individual cell of the plurality of photovoltaic cells is in a pocket separated from the remaining of the photovoltaic cells by the local line-shaped laser welded connection;
wherein the local line-shaped laser welded connection comprises a plurality of welds directly adjacent to each of the first, second, third and fourth electrical conductors on each side of each of the first, second, third and fourth electrical conductors; and
wherein a first thickness of the photovoltaic packaging between the first row of photovoltaic cells and the second row of photovoltaic cells is less than a second thickness of the photovoltaic packaging comprising the back layer, an individual cell of the plurality of photovoltaic cells, and the front layer,
wherein the front layer comprises a polyolefin and is reversibly adhered to the photovoltaic cells by a reusable adhesive.

5. The photovoltaic packaging according to claim 4, wherein the packaging is free from encapsulant layers which encapsulate and fully embed photovoltaic cells, so that the front layer and the back layer are in direct contact with the plurality of photovoltaic cells.

6. The photovoltaic packaging according to claim 4, the front layer and the back layer being configured such that the plurality of photovoltaic cells do not adhere or reversibly adhere to the back layer.

7. The photovoltaic packaging according to claim 4, each individual cell of the plurality of photovoltaic cells being separated from the remaining of the photovoltaic cells by the local line-shaped laser welded connection between the front layer and the back layer, the welded connection extending around the individual cell, that means around the perimeter of the individual cell, defining a pocket enclosing the individual cell.

8. The photovoltaic packaging according to claim 4, wherein the welded connection comprises more than one weld passing between each two adjacent photovoltaic cells of the plurality of photovoltaic cells.

9. The photovoltaic packaging according to claim 4, wherein the polymer front layer is a sheet having a thickness in the range of 20 to 1000 micrometer, and wherein the back layer is a sheet having a thickness in the range of 300 to 10000 micrometer.

10. The photovoltaic packaging according to claim 4, wherein the front layer comprises a polypropylene.

11. The photovoltaic packaging according to claim 4, wherein the plurality of photovoltaic cells is electrically connected to each other in a parallel electrical configuration.

12. A solar panel, having a rigid, UV protective top layer which is transparent to light connected to the photovoltaic packaging according to claim 4 on a front, sun facing side of the photovoltaic packaging.

13. A photovoltaic packaging according to claim 9, wherein the front layer is a sheet having a thickness in the range of 100 to 500 micrometer, and wherein the back layer is a sheet having a thickness in the range of 300 to 3000 micrometer.

14. The photovoltaic packaging according to claim 4, wherein the front layer is laser transmissive and the back layer is laser absorbent.

15. The photovoltaic packaging according to claim 4, wherein the local line-shaped laser welded connection comprises longitudinal welds and transverse welds; and
wherein each individual cell of the plurality of photovoltaic cells is surrounded by longitudinal welds and transverse welds so that each individual cell is enclosed in a pocket defined by the front layer and the back layer and the longitudinal welds and the transverse welds.

16. The photovoltaic packaging according to claim 4, wherein the local line-shaped laser welded connection comprises longitudinal welds and transverse welds; and wherein at a junction of a longitudinal weld and a transverse weld, the local line-shaped laser welded connection comprises a plurality of circular welds surrounding a connecting member that passes through the front layer and the back layer, the connecting member connected to a supporting structure.

\* \* \* \* \*